United States Patent
Wang et al.

(10) Patent No.: US 9,070,774 B2
(45) Date of Patent: Jun. 30, 2015

(54) PROCESS FOR FABRICATING SILICON-ON-NOTHING MOSFETS

(75) Inventors: Ta-Wei Wang, Taipei (TW); Chih-Sheng Chang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 632 days.

(21) Appl. No.: 13/336,191

(22) Filed: Dec. 23, 2011

(65) Prior Publication Data

US 2012/0094456 A1   Apr. 19, 2012

Related U.S. Application Data

(63) Continuation of application No. 12/143,612, filed on Jun. 20, 2008, now Pat. No. 8,106,468.

(51) Int. Cl.
| | |
|---|---|
| H01L 21/336 | (2006.01) |
| H01L 29/786 | (2006.01) |
| H01L 29/06 | (2006.01) |
| H01L 29/66 | (2006.01) |

(52) U.S. Cl.
CPC ...... *H01L 29/78603* (2013.01); *H01L 29/0649* (2013.01); *H01L 29/66772* (2013.01); *H01L 29/78654* (2013.01)

(58) Field of Classification Search
CPC .............. H01L 29/0649; H01L 29/78696; H01L 21/764

USPC ................... 438/197, 299–301; 257/276, 410
See application file for complete search history.

(56) References Cited

U.S. PATENT DOCUMENTS

| | | | |
|---|---|---|---|
| 6,727,186 B1 | 4/2004 | Skotnicki et al. | |
| 7,078,298 B2 | 7/2006 | Lee et al. | |
| 7,195,963 B2 * | 3/2007 | Orlowski et al. | 438/197 |
| 7,605,443 B2 * | 10/2009 | Ogura | 257/522 |
| 7,683,362 B2 | 3/2010 | Ohta et al. | |
| 7,989,296 B2 * | 8/2011 | Lee et al. | 438/300 |
| 2008/0142838 A1 | 6/2008 | Ohta et al. | |
| 2008/0299733 A1 | 12/2008 | Press et al. | |

FOREIGN PATENT DOCUMENTS

JP   2007035676 A   2/2007

OTHER PUBLICATIONS

Monfray, S., et al., "SON (Silicon-on-Nothing) Technological CMOS Platform: Highly Performant Devices and SRAM Cells," IEEE, 2004, 4 pages.

Sato, T., et al., "SON (Silicon on Nothing) MOSFET Using ESS (Empty Space in Silicon) Technique for SoC Applications," IEEE, 2001, 4 pages.

* cited by examiner

*Primary Examiner* — David Vu
(74) *Attorney, Agent, or Firm* — Slater & Matsil, L.L.P.

(57) ABSTRACT

A semiconductor device includes a gate stack; an air-gap under the gate stack; a semiconductor layer vertically between the gate stack and the air-gap; and a first dielectric layer underlying and adjoining the semiconductor layer. The first dielectric layer is exposed to the air-gap.

19 Claims, 6 Drawing Sheets

PROCESS FOR FABRICATING SILICON-ON-NOTHING MOSFETS

This application is a continuation of U.S. patent application Ser. No. 12/143,612, filed on Jun. 20, 2008, entitled "Process for Fabricating Silicon-on-Nothing MOSFETs," which application is hereby incorporated herein by reference in its entirety.

TECHNICAL FIELD

This invention relates generally to semiconductor devices, and more particularly to metal-oxide-semiconductor field-effect transistors (MOSFETs), and even more particularly to silicon-on-nothing MOSFETs.

BACKGROUND

With the increasing down-scaling of integrated circuits, metal-oxide-semiconductor field-effect transistors (MOSFET) need to be increasingly smaller, with increasingly shorter gates. This requires the junctions, particularly the junctions between lightly doped source/drain regions and pocket regions, to be shallower. However, due to the diffusion of the implanted impurities, it is very difficult to reduce the depth of the junction to about 50 Å for short channel effect control (SCE), which is a preferred junction depth for future small-scale MOSFETs.

What makes the reduction of junction depths more difficult is that for smaller MOSFETs, the pocket regions need to have higher impurity concentrations. However, with heavier pocket implantations, several adverse effects may be resulted. For example, although the short channel effect (SCE) and drain-induced barrier lowering (DIBL) may be better, the carrier mobility of the carriers in the channel region is degraded, resulting in smaller device drive currents.

To solve these problems, silicon-on-nothing (SON) MOSFETs have been proposed. SON MOSFETs have air-gaps under channel regions. With the air-gaps, the SCE of the SON MOSFETs is improved, and leakage currents can be reduced. However, the processes for forming the SON MOSFETs face challenges. For example, a process was proposed by Toshiba to form the air-gaps. The process includes forming parallel trenches in a silicon substrate, and annealing the silicon substrate to form an air-gap, wherein the anneal causes the migration of silicon, and a layer of silicon seals the air-gap. The drawback of this process is that the thickness of the silicon layer over the air-gap is greater than desirable, and the thickness of the silicon layer may reach about 0.3 μm, which is far greater than the desirable thickness for example, less than 150 Å. In addition, it is hard to control the final thickness of the silicon channel. For process reasons, it is difficult to reduce the thickness of the silicon layer on the air-gap.

Another conventional process includes forming a silicon germanium layer on a silicon substrate, forming a silicon layer on the silicon germanium layer, forming a gate over the silicon layer, forming source and drain recesses, and etching the silicon germanium layer to form the air-gap. This process appears to solve the above-discussed problems. However, up to now, process difficulties prevented the implementation of the idea on silicon substrate. The reason was that during the subsequent filling of the source and drain recesses, the filing material was undesirably grown in the air-gap, and hence the air-gap was refilled. New methods are thus needed to form MOSFETs with SON structures.

SUMMARY OF THE INVENTION

In accordance with an embodiment, a method of forming a semiconductor device comprises providing a semiconductor substrate, forming a semiconductor layer over the semiconductor substrate, forming an air-gap between the semiconductor substrate and the semiconductor layer, forming a gate dielectric over the semiconductor layer, forming a gate electrode over the gate dielectric, forming a first oxide layer vertically between the semiconductor layer and the air-gap and forming a second oxide layer vertically between the semiconductor substrate and the air-gap.

In accordance with another embodiment, a method of forming a semiconductor device comprises providing a silicon substrate, epitaxially growing a sacrificial layer on the silicon substrate, epitaxially growing a silicon layer on the sacrificial layer, forming a gate dielectric over the silicon layer, forming a gate electrode over the gate dielectric, forming a spacer on sidewalls of the gate dielectric and the gate electrode, etching the silicon layer, the sacrificial layer, and the silicon substrate along the spacer to form a recess, removing the sacrificial layer to form an air-gap between the silicon layer and the silicon substrate, forming dielectric layers on exposed surfaces of the silicon layer and the silicon substrate, wherein the dielectric layers comprise first portions inside the air-gap, and second portions outside the air-gap, removing the second portions of the dielectric layers and epitaxially growing a semiconductor material to fill the recess, wherein the air-gap is substantially free from the semiconductor material.

In accordance with yet another embodiment, a method comprises providing a substrate, forming an air-gap over the substrate, forming a semiconductor layer over the air-gap, forming a gate dielectric layer over the semiconductor layer and forming a gate electrode over the gate dielectric layer.

By forming dielectric layers in air-gaps before sealing the air-gaps, the adverse growth of semiconductor material in the air-gaps is substantially eliminated, and hence the air-gaps may be formed successfully.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming silicon-on-nothing (SON) metal-oxide-semiconductor field-effect transistors (MOSFET) and the resulting structures are provided. The intermediate stages of manufacturing a preferred embodiment of the present invention are illustrated. Throughout the various views and illustrative embodiments of the present invention, like reference numbers are used to designate like elements.

Figure 1:
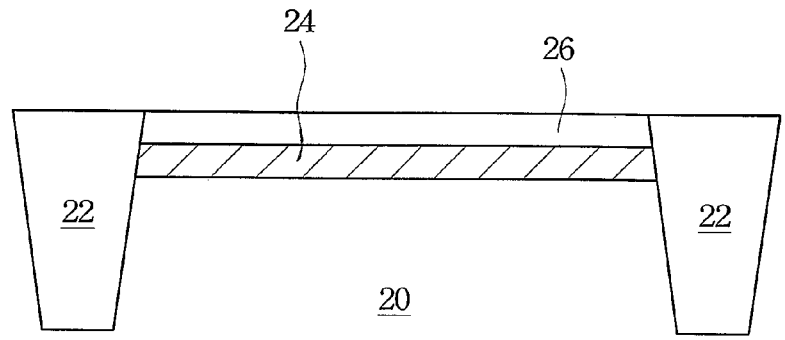
FIGS. 1 through 10 are cross-sectional views of intermediate stages in the manufacturing of an embodiment of the present invention.

Referring to FIG. 1, substrate 20 is provided. In an embodiment, substrate 20 is formed of bulk silicon or other commonly used semiconductor material. Shallow trench isolation (STI) regions 22 are formed in substrate 20 to isolate device regions. As is known in the art, STI regions 22 may be formed by etching substrate 20 to form recesses, and then filling the recesses with dielectric materials.

Semiconductor layer 24 is formed on substrate 20, and is used as a sacrificial layer. In the preferred embodiment, semiconductor layer 24 comprises silicon germanium, and hence is referred to as silicon germanium (SiGe) layer 24 throughout the description, although it may also be formed of another materials having different etching characteristics from that of substrate 20. Preferably, SiGe layer 24 is epitaxial grown using selective epitaxial growth (SEG). In an exemplary embodiment, SiGe layer 24 is formed using reduced pressure chemical vapor deposition in a chamber. The precursors may include Si-containing gases and Ge-containing gases, such as $SiH_4$ and $GeH_4$, respectively. SiGe layer 24 may have a germanium atomic percentage of between about 5 percent and about 30 percent, although different percentages may also be used. The thickness of SiGe layer 24 may be greater than about 100 Å, for example, between about 100 Å and about 800 Å. One skilled in the art will realize, however, that the thickness and other dimensions recited throughout the description are merely examples, and may be changed with the scales of integrated circuits.

Next, semiconductor layer 26 is epitaxially grown on SiGe layer 24. In the preferred embodiment, semiconductor layer 26 is formed of substantially a same material as that of substrate 20, for example, pure or substantially pure silicon (although commonly used impurities may be in-situ doped or implanted). Hence, semiconductor layer 26 is also referred to as silicon layer 26 throughout the description, although other semiconductor materials having different etching characteristics from sacrificial layer 24 may also be used. An exemplary thickness of silicon layer 26 is between about 50 Å and about 300 Å.

Figure 2:
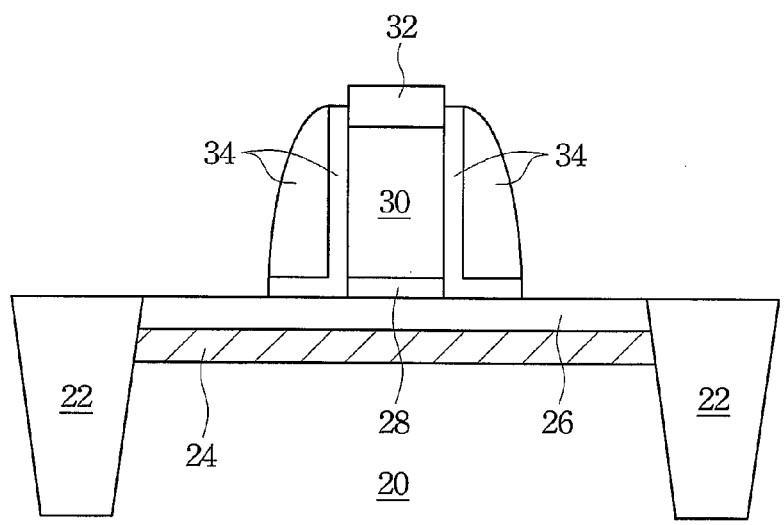

FIG. 2 illustrates the formation of a gate stack, including gate dielectric 28 and gate electrode 30, on silicon layer 26. Gate dielectric 28 preferably includes commonly used dielectric materials such as oxides, nitrides, oxynitrides, high-k materials, combinations thereof, and multi-layers thereof. Gate electrode 30 may be formed of polysilicon. Alternatively, gate electrode 30 is formed of other commonly used conductive materials such as metals, metal silicides, metal nitrides, and combinations thereof. Hard mask 32, which may be formed of silicon nitride, for example, may be formed on gate electrode 30. As is known in the art, gate dielectric 28, gate electrode 30, and hard mask 32 may be formed by stacking a hard mask layer and a gate electrode layer on a gate dielectric layer, and then patterning the stacked layers.

FIG. 2 also illustrates the formation of dummy (gate) spacers 34. The thickness of dummy spacers 34 may be between about 50 Å and about 400 Å. Dummy spacers 34 may be formed of a single layer including commonly used spacer materials, such as silicon nitride, silicon oxynitride, silicon oxide, tetra-ethyl-ortho-silicate (TEOS) oxide, and combinations thereof. Alternatively, dummy spacers 34 are each a composite layer including more than one layer, for example, a silicon nitride layer on a TEOS oxide layer.

Figure 3:
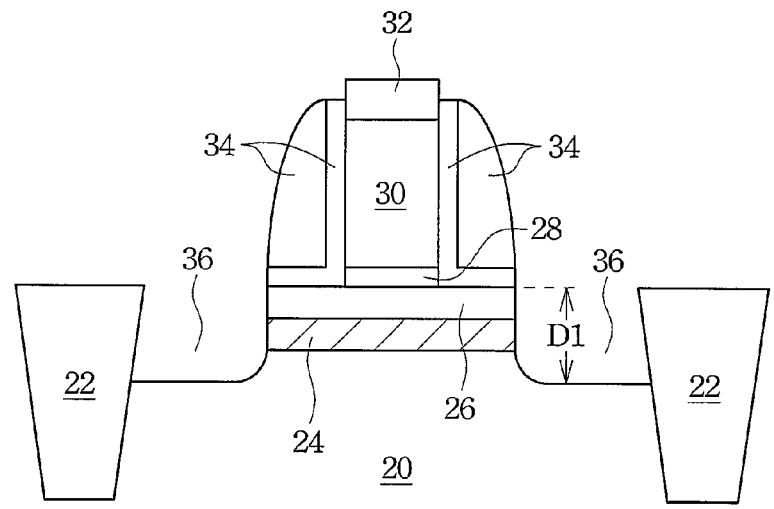

Next, as shown in FIG. 3, recesses 36 are formed. Preferably, recesses 36 are formed along the edges of spacers 34 by etching anisotropically or isotropically through silicon layer 26, SiGe layer 24, and substrate 20. The depth D1 of recesses 36 may be between about 150 Å and about 800 Å, although depth D1 may be greater or smaller. After the recessing, the side edges of SiGe layer 24 are exposed to recesses 36.

Figure 4A:
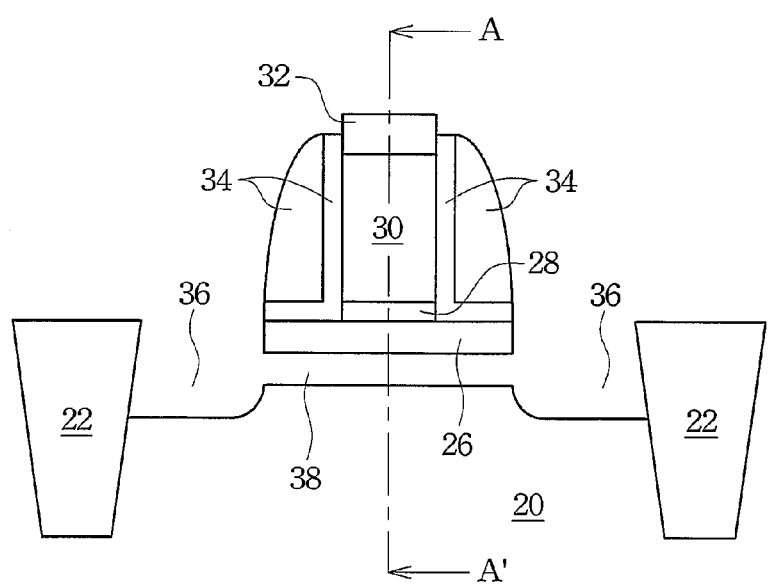
Figure 4B:
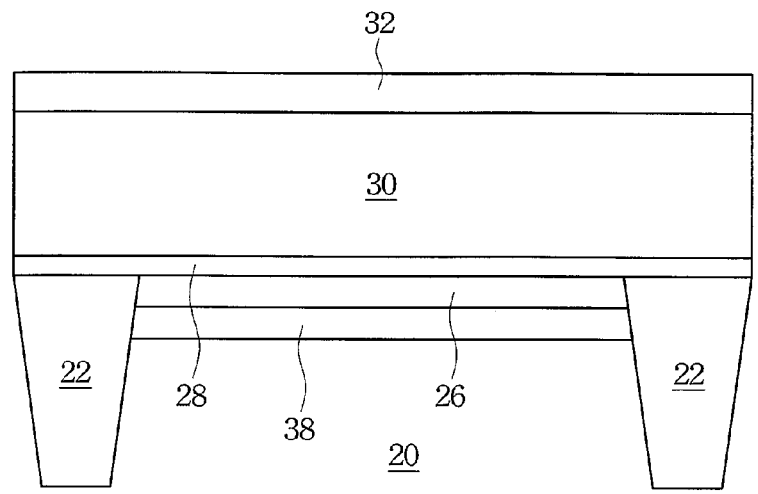

Referring to FIG. 4A, an etching is performed using an etchant attacking semiconductor (SiGe) layer 24, but not other exposed materials including substrate 20, silicon layer 26, and STI regions 22. In the embodiment semiconductor layer 24 is formed of SiGe, the etchant may include $CF_4$ and an oxygen-containing gas. Accordingly, SiGe layer 24 is removed, while other exposed materials are substantially intact. In the resulting structure, air-gap 38 is formed to separate the overlying silicon layer 26 from underlying substrate 20. It is realized that although FIG. 4A shows that silicon layer 26 does not have any support underneath it, the support to silicon layer 26 and the overlying gate structure is provided by STI regions 22, as shown in FIG. 4B. FIG. 4B is a cross-sectional view taken along a vertical plane crossing line A-A' in FIG. 4A.

Figure 5:
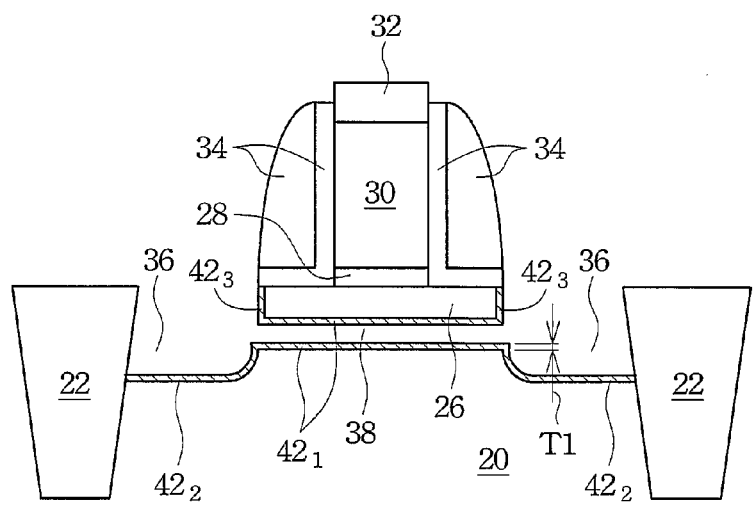

Referring to FIG. 5, a re-oxidation is preformed. In an embodiment, the re-oxidation is performed in an oxygen-containing environment, and may be performed using thermal oxidation. Silicon oxide layers 42 are generated on the exposed surfaces of substrate 20 and silicon layer 26, wherein silicon oxide layers 42 include portions $42_1$ in air-gap 38, portions $42_2$ in recesses 36, and portions $42_3$ on side edges of silicon layer 26. In an embodiment, the thickness T of silicon oxide layers 42 is greater than about 5 Å.

Figure 6:
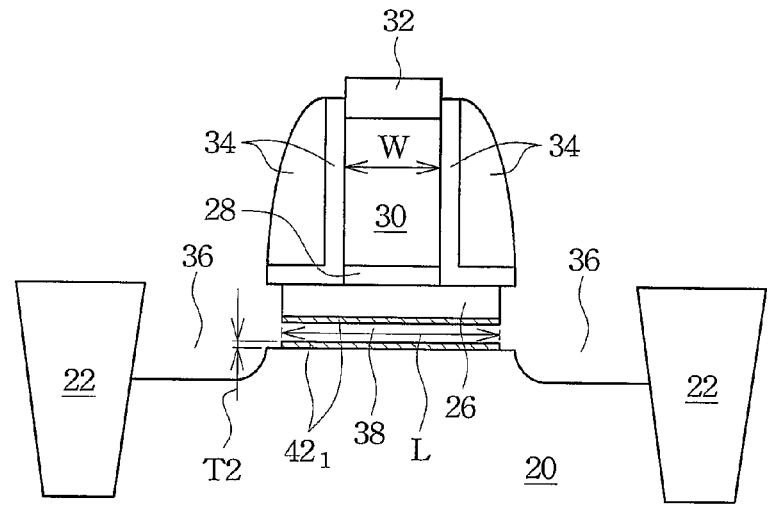

Referring to FIG. 6, a dry etch is performed to remove portions $42_2$ and $42_3$ of silicon oxide layers 42. Portions $42_1$ of silicon oxide layers 42, which are in air-gap 38, are preserved. In an exemplary embodiment, the etchant gas for the dry etch comprises $CF_4$. Although a bias may be applied for the dry etch, the dry etch includes an isotropic component, so that portions $42_2$, which may be partially underlying gate spacers 34, are also fully removed, and the side edges of silicon layer 26 are exposed. If the horizontal etching component of the dry etch has a first etching rate, and the vertical etching component of the dry etch has a second etching rate, the ratio of the first etching rate to the second etching rate may be between about 0.2 and 0.5, and preferably between about 0.3 and 0.4. In the resulting structure, the remaining portions $42_1$ of silicon oxide layers 42 have a thickness T2 greater than about 3 Å. Also, the length L of the remaining portions $42_1$ is preferably greater than the width W of gate electrode 30. In the resulting structure, the edges of silicon layer 26 are substantially vertically aligned to side edges of portions $42_1$ of the silicon oxide layers 42.

Optionally, a native-oxide removal step may be performed, wherein the native-oxide removal step may be performed after the dry etch, and before a subsequent epitaxial growth. The native-oxide removal step may be performed isotropically. In alternative embodiments, no native-oxide removal step is performed.

Figure 7:
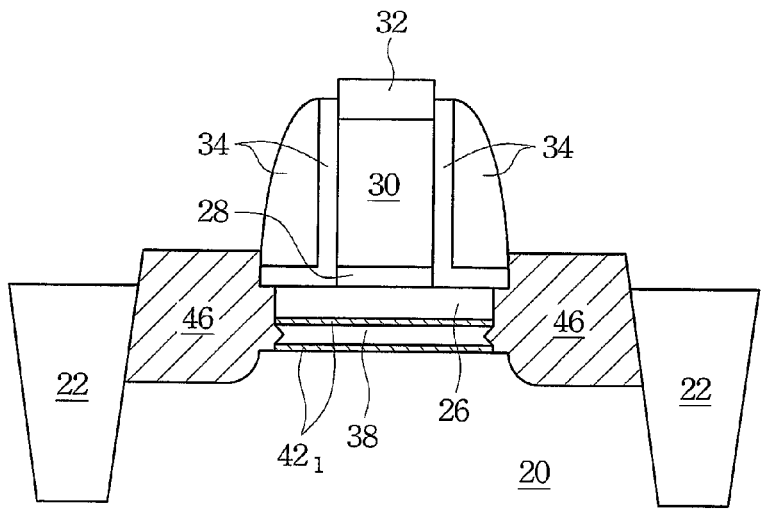

Referring to FIG. 7, recesses 36 are filled with semiconductor material 46. Depending on the type of the resulting MOSFET, the filling material may be silicon, silicon germanium, silicon carbon, or other semiconductor materials. The filling of semiconductor material 46 may be performed by selective epitaxially growth (SEG). An n-type or p-type impurity may be in-situ doped with the proceeding of the SEG. Alternatively, no n-type or p-type impurity is doped during the SEG. In the case silicon carbon is filled, the carbon atomic percentage in semiconductor material 46 may be greater than about 1 percent, and more preferably between about 1 percent and about 3 percent. In the case silicon germanium is filled, the germanium atomic percentage in semiconductor material 46 may be between about 5 percent and about 40 percent.

Due to the portions $42_1$ of silicon oxide layers 42 in air-gap 38, and also due to the selectivity of the SEG, semiconductor material 46 will not grow in air-gap 38. In the resulting structure, air-gap 38 is preserved and sealed. As a comparison, if there were no silicon oxide portions $42_1$ in air-gap 38, semiconductor material 46 will be grown on the surfaces of the portions of silicon layer 26 and substrate 20 exposed to air-gap 38, and air-gap 38 will eventually be filled, or substantially filled, by semiconductor material 46. Preferably, the formation of semiconductor material 46 is conformal, although non-conformal formation may also be adopted.

Figure 8:
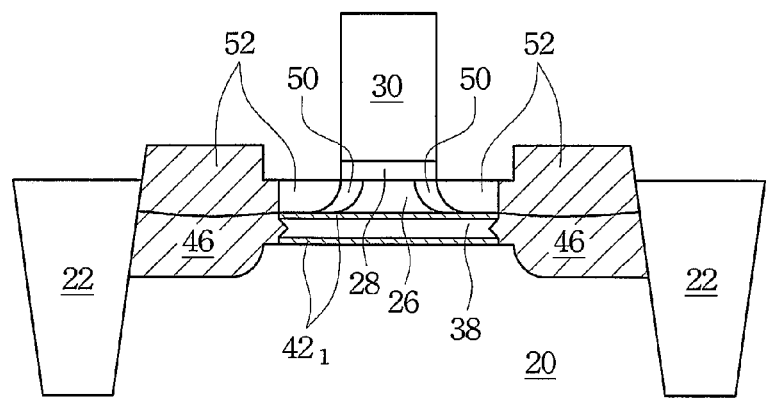

In FIG. 8, dummy spacers 34 and hard mask 32 are removed, and pocket regions 50 are formed by implantations. In the case the resulting MOSFET is an n-type MOSFET, pocket regions 50 are implanted with p-type impurities, such as boron and/or indium. The implantation may be tilted. With the air-gap 38, the depth of pocket regions 50 is limited to the depth of silicon layer 26, and the subsequent thermal anneals are not able to increase the depth of pocket regions 50. An advantageous feature of the present invention is that it is possible to implant pocket regions 50 to a very lower impurity concentration than conventions MOSFET having no air-gaps without incurring increased leakage currents. In an exemplary embodiment, the impurity concentration in pocket regions 50 may be less than about $6E13/cm^3$.

Lightly doped drain/source (LDD) regions 52 are also formed, preferably by implanting an n-type impurity (in the case the MOSFET is an n-type MOSFET) or a p-type impurity (in the case the MOSFET is a p-type MOSFET). The implantation for LDD regions 52 may be vertical. Again, the depth of the LDD regions 52 is limited by the thickness of silicon layer 26, and hence very shallow LDD regions may be formed.

Figure 9:
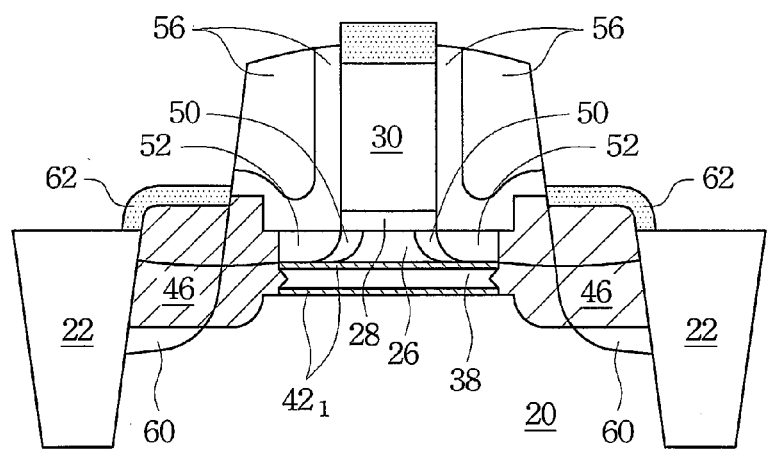

FIG. 9 illustrates the formation of spacers 56, source/drain regions 60, and silicide regions 62. The thickness of spacers 56 may be equal to, greater than, or less than, the thickness of dummy spacer 34 (refer to FIG. 7). Source/drain regions 60 may be preformed by implanting an impurity of an appropriate type. Silicide regions 62 are then formed. As is well known in the art, silicide regions 62 may be formed by blanket depositing a thin layer of metal, such as nickel, cobalt, and the like. The substrate is then heated, causing silicon to react with the metal where contacted. After the reaction, a layer of metal silicide is formed between silicon and metal. The un-reacted metal is selectively removed through the use of an etchant that attacks metal but does not attack silicide regions 62.

Figure 10:
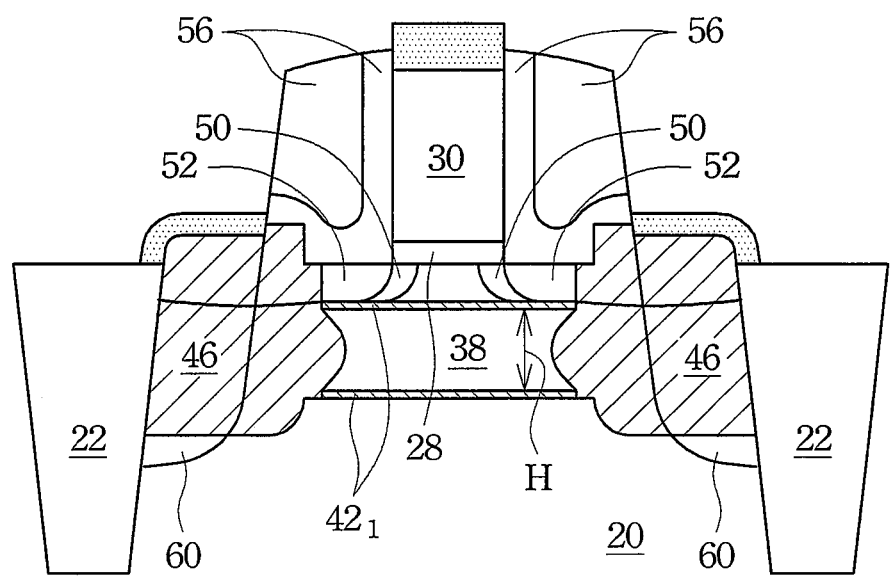

By forming oxides in air-gap 38 before the filling of semiconductor material 46 into recesses, semiconductor material 46 will not be grown in air-gap 38. This ensures the formation of air-gap 38. As a result, a silicon-on-nothing MOSFET is formed. An advantageous feature of the embodiments of the present invention is that air-gap 38 may have a great height H, as shown in FIG. 10, without the concern that semiconductor material 46 may fill air-gap 38. Accordingly, the bottom of air-gap 38 may be substantially leveled with, or even lower than, the bottom of source/drain regions 60. With an air-gap 38 having a great height, the source and drain junction punch-through may be substantially eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a semiconductor substrate;
   forming a semiconductor layer over the semiconductor substrate;
   forming an air-gap between the semiconductor substrate and the semiconductor layer;
   forming a gate dielectric over the semiconductor layer;
   forming a gate electrode over the gate dielectric;
   forming a first oxide layer vertically between the semiconductor layer and the air-gap;
   forming a second oxide layer vertically between the semiconductor substrate and the air-gap; and
   removing non-air-gap portions of the first oxide layer and the second oxide layer, and during the step of removing non-air-gap portions of the first oxide layer and the second oxide layer, keeping top surfaces of air-gap portions of the first oxide layer and the second oxide layer exposed to the air-gap.

2. The method of claim 1, wherein the step of forming the air-gap comprises:
   forming a sacrificial layer between the semiconductor substrate and the semiconductor layer;
   after the step of forming the semiconductor layer, forming a recess in the semiconductor layer and the sacrificial layer; and
   removing the sacrificial layer through the recess.

3. The method of claim 2, wherein the steps of forming the first and the second oxide layers comprise:
   after the step of removing the sacrificial layer, oxidizing the semiconductor layer and the semiconductor substrate to form the first and the second oxide layers; and
   removing portions of the first and the second oxide layers outside the air-gap.

4. The method of claim 3, wherein during the step of removing the portions of the first and the second oxide layers outside the air-gap, a horizontal removal rate of the step of the removing to a vertical removal rate of the step of the removing is between about 0.2 and about 0.5.

5. The method of claim 2 further comprising:
   after the step of removing the sacrificial layer, epitaxially growing a semiconductor material in the recess, wherein the semiconductor material seals a space left by the sacrificial layer to form the air-gap.

6. The method of claim 1 further comprising:
   after the step of forming the air-gap, forming a pocket region in the semiconductor layer; and
   forming a lightly doped source/drain region having at least a portion in the semiconductor layer.

7. The method of claim 1, wherein the step of forming the semiconductor layer comprises an epitaxial growth.

8. A method of forming a semiconductor device, the method comprising:
   providing a silicon substrate;
   epitaxially growing a sacrificial layer on the silicon substrate;
   epitaxially growing a silicon layer on the sacrificial layer;
   forming a gate dielectric over the silicon layer;
   forming a gate electrode over the gate dielectric;
   forming a spacer on sidewalls of the gate dielectric and the gate electrode;
   etching the silicon layer, the sacrificial layer, and the silicon substrate along the spacer to form a recess;

removing the sacrificial layer to form an air-gap between the silicon layer and the silicon substrate;

forming dielectric layers on exposed surfaces of the silicon layer and the silicon substrate, wherein the dielectric layers comprise first portions inside the air-gap, and second portions outside the air-gap;

removing the second portions of the dielectric layers and during the step of removing the second portions of the dielectric layers, keeping top surfaces of the first portions of the dielectric layers exposed to the air-gap; and epitaxially growing a semiconductor material to fill the recess, wherein the air-gap is substantially free from the semiconductor material.

9. The method of claim 8, wherein the step of removing the second portions of the dielectric layers has a horizontal removal rate and a vertical removal rate, and wherein a ratio of the horizontal removal rate to the vertical removal rate is between about 0.2 and about 0.5.

10. The method of claim 8, wherein the semiconductor material comprises silicon germanium.

11. The method of claim 8 further comprising an additional removal step for removing a native oxide formed on surfaces of the silicon layer and the silicon substrate.

12. The method of claim 8, wherein the step of forming the dielectric layers comprises oxidizing exposed surfaces of the silicon layer and the silicon substrate.

13. The method of claim 8 further comprising:
after the step of epitaxially growing the semiconductor material, removing the spacer;
performing a first implantation to form a pocket region in the silicon layer; and
performing a second implantation to form a lightly doped source/drain region having at least a portion in the silicon layer.

14. The method of claim 13 further comprising:
forming an additional spacer on sidewalls of the gate dielectric and the gate electrode;

performing a third implantation to form a source/drain region in the semiconductor material; and forming a silicide region on the source/drain region.

15. A method comprising:
providing a substrate;
forming an air-gap over the substrate;
forming a semiconductor layer over the air-gap;
forming a first silicon oxide layer between the semiconductor layer and the air-gap;
removing sidewall portions of the first silicon oxide layer and during the step of removing sidewall portions of the first silicon oxide layer, keeping a top surface of a non-sidewall portion of the first silicon oxide layer exposed to the air-gap;
forming a gate dielectric layer over the semiconductor layer; and
forming a gate electrode over the gate dielectric layer.

16. The method of claim 15, further comprising:
forming a second silicon oxide layer between the substrate and the air-gap; and
forming a silicon germanium region extending into the substrate.

17. The method of claim 16, wherein the silicon germanium region adjoins the semiconductor layer and is exposed to the air-gap.

18. The method of claim 16, further comprising:
forming the first silicon oxide layer having a thickness greater than about 5 Å; and
forming the second silicon oxide layer having a thickness greater than about 5 Å.

19. The method of claim 16, further comprising:
configuring the semiconductor layer, the first silicon oxide layer and the second silicon oxide layer such that an edge of the semiconductor layer is vertically aligned to an edge of the first silicon oxide layer and an edge of the second silicon oxide layer.

* * * * *